United States Patent
Vigen et al.

[11] Patent Number: 6,044,290
[45] Date of Patent: Mar. 28, 2000

[54] TIME-RESOLVED DIGITAL SUBTRACTION MAGNETIC RESONANCE ANGIOGRAPHY USING ECHO-PLANAR IMAGING

[75] Inventors: Karl K Vigen; Charles A Mistretta; Thomas M Grist; Frank R Korosec; Richard Frayne, all of Madison, Wis.

[73] Assignee: Wisconsin Alumni Research Foundation, Madison, Wis.

[21] Appl. No.: 09/055,503

[22] Filed: Apr. 6, 1998

Related U.S. Application Data

[60] Provisional application No. 60/043,534, Apr. 11, 1997.

[51] Int. Cl.$^7$ .................................................... A61B 5/055
[52] U.S. Cl. ............................ 600/419; 600/420; 324/306; 324/309
[58] Field of Search .................................. 600/410, 419, 600/420; 324/306, 307, 309

[56] References Cited

U.S. PATENT DOCUMENTS

| | | | |
|---|---|---|---|
| Re. 32,701 | 6/1988 | Moran | 324/309 |
| 4,204,225 | 5/1980 | Mistretta | 358/111 |
| 4,830,012 | 5/1989 | Riederer . | |
| 5,417,213 | 6/1995 | Prince . | |
| 5,560,360 | 10/1996 | Filler et al. | 600/408 |
| 5,713,358 | 2/1998 | Mistretta et al. . | |
| 5,810,727 | 9/1998 | Groen | 600/410 |

OTHER PUBLICATIONS

Dynamic Contrast Enhanced, NMR Perfusion Imaging of Regional Cerebral Ischaemia in Rats Using K–Space Substitution, SMR Eleventh Annual Meeting 1992 abs. 1138, R.A. Jones, et al.

Reduction of Field of View for Dynamic Imaging, MRM 31:691–694 1994, Hu, et al.

Article published in 3rd SMR, 1, 197.1995, Federickson and Pelc.

*Primary Examiner*—Ruth S. Smith
*Attorney, Agent, or Firm*—Quarles & Brady, LLP

[57] ABSTRACT

A dynamic MRA study of a subject is performed using a 3D echo-planar imaging pulse sequence. Four phase encoding views are acquired for each pulse repetition period (TR) and this enables higher resolution images to be acquired without a reduction of temporal frame rate or a loss of image CNR.

11 Claims, 3 Drawing Sheets

TIME-RESOLVED DIGITAL SUBTRACTION MAGNETIC RESONANCE ANGIOGRAPHY USING ECHO-PLANAR IMAGING

CROSS-REFERENCE TO RELATED APPLICATION

This application is based on Provisional Application Ser. No. 60/043,534 filed on Apr. 11, 1997.

This invention was made with United States Government support awarded by NIH Grant Nos. R01-HL51370; R29-HL57501; K08-HL02848; R01-HL5247. The United States Government has certain rights in this invention.

BACKGROUND OF THE INVENTION

The field of the invention is magnetic resonance angiography ("MRA"), and particularly, dynamic studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Earlier images in the sequence may not have sufficient contrast in the suspect vasculature, and later images may become difficult to interpret as the contrast agent reaches veins and diffuses into surrounding tissues. Subtractive methods such as that disclosed in U.S. Pat. No. 4,204,225 entitled "Real-Time Digital X-ray Subtraction Imaging" may be used to significantly enhance the diagnostic usefulness of such images.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. Each measurement is referred to in the art as a "view" and the number of views determines the resolution of the image. The resulting set of received NMR signals, or views, are digitized and processed to reconstruct the image using one of many well known reconstruction techniques. The total scan time is determined in part by the number of measurement cycles, or views, that are acquired for an image, and therefore, scan time can be reduced at the expense of image resolution by reducing the number of acquired views.

MR angiography (MRA) has been an active area of research. Two basic techniques have been proposed and evaluated. The first class, time-of-flight (TOF) techniques, consists of methods which use the motion of the blood relative to the surrounding tissue. The most common approach is to exploit the differences in signal saturation that exist between flowing blood and stationary tissue. This is know as flow-related enhancement, but this effect is misnamed because the improvement in blood-tissue contrast is actually due to the stationary tissues experiencing many excitation pulses and becoming saturated. Flowing blood, which is moving through the excited section, is continually refreshed by spins experiencing fewer excitation pulses and is, therefore, less saturated. The result is the desired image contrast between the high-signal blood and the low-signal stationary tissues.

MR methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase difference or complex difference between the pair of velocity-encoded images. Phase contrast MRA techniques have been extended so that they are sensitive to velocity components in all three orthogonal directions.

Despite the tremendous strides made in recent years, at many clinical sites MRA is still considered a research tool and is not routinely used in clinical practice. More widespread application of either TOF or PC techniques is hampered by the presence of a variety of deleterious image artifacts, which can mask and, in some cases, even mimic pathology. These artifacts generally result in a lower specificity, as well as compromised sensitivity.

To enhance the diagnostic capability of MRA a contrast agent such as gadolinium can be injected into the patient prior to the MRA scan. As described in U.S. Pat. No. 5,417,213 the trick is to acquire the central k-space views at the moment the bolus of contrast agent is flowing through the vasculature of interest. This is not an easy timing to achieve as part of a routine clinical procedure and a number of solutions have been proposed.

In U.S. Pat. No. 5,713,358 entitled "Method For Producing A Time-Resolved Series Of 3D Magnetic Resonance Angiograms During The First Passage Of Contrast Agent" a method is described for rapidly acquiring a series of 3D MRA data sets during a dynamic study. The objective is to acquire as many images as possible during the dynamic study so that one of the images will depict the subject when the vasculature is at maximum contrast. This requires that fast NMR data acquisition methods be used.

Most NMR scans currently used to produce medical images require many minutes to acquire the necessary data for a clinically useful image. The reduction of this scan time to seconds rather than minutes is the major obstacle in performing clinical dynamic studies using MRI methods.

The most common MRI method currently used for non-triggered, time-resolved imaging is to use an echo-planar imaging ("EPI") pulse sequence such as that first described by Peter Mansfield (J. Phys. C. 10: L55–L58, 1977). In principle the EPI scan enables imaging of dynamic processes occurring with periods measured on the order of a few hundred milliseconds. However, time-resolved EPI has been considered un-suitable for contrast enhanced MRA because it exhibits a low contrast between blood and surrounding tissues due to the long time intervals (e.g. 100 ms) between RF excitations. EPI also has enhanced sensitivity to a variety of flow-related artifacts, and EPI images can be blurred due to $T_2^*$-modulation of k-space.

A number of methods have been developed to increase the temporal resolution of MRI scans using pulse sequences that are applicable to MRA. In a method known in the art as "MR fluoroscopy" and described in U.S. Pat. No. 4,830,012, the subject is scanned by continuously and repeatedly acquiring the N phase encoding views needed for a complete image. Rather than waiting for an entirely new set of N views before reconstructing the next image, however, images are reconstructed at a much higher rate by using the most recent N views. In other words, an image is reconstructed from newly acquired views as well as views used in reconstructing previous images in the dynamic study. While very high temporal rates are achieved with MR fluoroscopy, the image contrast is not satisfactory for MRA because the central views in k-space, which dominate the overall image contrast, are still updated at the much slower inherent scan rate (i.e. NxTR).

Another method for increasing temporal resolution of MRI images is referred to in the art as "keyhole" imaging. As described, for example, by R.A. Jones, et al. in *"Dynamic, Contrast Enhanced, NMR Perfusion Imaging Of Regional Cerebral Ischaemia In Rats Using K-Space Substitution"*, SMR Eleventh Annual Meeting 1992 abs. 1138, a sequence of images is acquired during a dynamic study in which a contrast agent is injected in the subject. The first image in the sequence is a reference image in which all the phase encoding views (e.g. 128 views) are acquired. Subsequent images are produced, however, by only acquiring the central views (e.g. the central 32 views). These keyhole scans can obviously be acquired much faster than complete scans and the temporal rate is increased proportionately. The keyhole images are reconstructed using the most recent central k-space views combined with the outer, peripheral k-space views from the reference scan. Unfortunately, in situations where the low spatial frequency changes in the reconstructed images do not capture the evolution of the dynamic study, k-space keyhole imaging is not appropriate. This is a problem when contrast changes in small regions are to be studied, and in such studies the number of central views acquired must be increased to the point where the gain in temporal resolution is lost.

Related to the k-space keyhole imaging method is a method known in the art as limited field of view ("FOV") dynamic imaging. As described, for example, by Hu and Parrish, published in *Magnetic Resonance in Medicine*, Vol. 31, pp. 691–694, 1994, and by Frederickson and Pelc, 3rd SMR, 1, 197.1995; this method is applied to dynamic studies in which the changing part of the image occupies no more than one half the full FOV. A reference image representing the static part of the image is produced at the beginning of the study and a series of images encompassing only the dynamic, central portion of the image are produced using half the number of phase encoding views. These dynamic images can be acquired at a higher temporal rate because only half the number of views (either the odd or even views) need be acquired. The dynamic and static portions of the image are combined to produce a corresponding series of full FOV images. Of course, if changes occur in the static portion of the image, the information obtained from these regions will no longer accurately remove artifacts aliased into the small FOV.

Dynamic MRA studies currently use fast gradient recalled echo pulse sequences because their short repetition times (TR) enable a maximum number of views to be acquired at a given temporal frame rate. As indicated above by the many schemes which have been proposed, there is a strong need for methods which will enable the quality of the acquired images to be improved without slowing the temporal frame rate.

SUMMARY OF THE INVENTION

The present invention is a method for improving the quality of MRA images acquired during a dynamic study without slowing the temporal frame rate. More specifically, the present invention is a dynamic study in which the views for successive image frames are acquired using a succession of echo-planar pulse sequences in which a plurality of views are acquired in each pulse sequence. The longer repetition time (TR) of the EPI pulse sequence improves the image contrast and the frame rate is not slowed because a plurality of views are acquired during each TR period. The well-known disadvantages of using an EPI pulse sequence in time-resolved MRA are avoided by acquiring only a few (e.g., 4) views during each TR period.

A general object of the invention is to improve image quality without slowing the temporal frame rate during a time-resolved MRA study. It has been discovered that by using an EPI pulse sequence rather than a fast gradient recalled echo pulse sequence many more views per image frame can be acquired. In addition, the longer repetition time (TR) improves the CNR of the images when a contrast agent is used.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
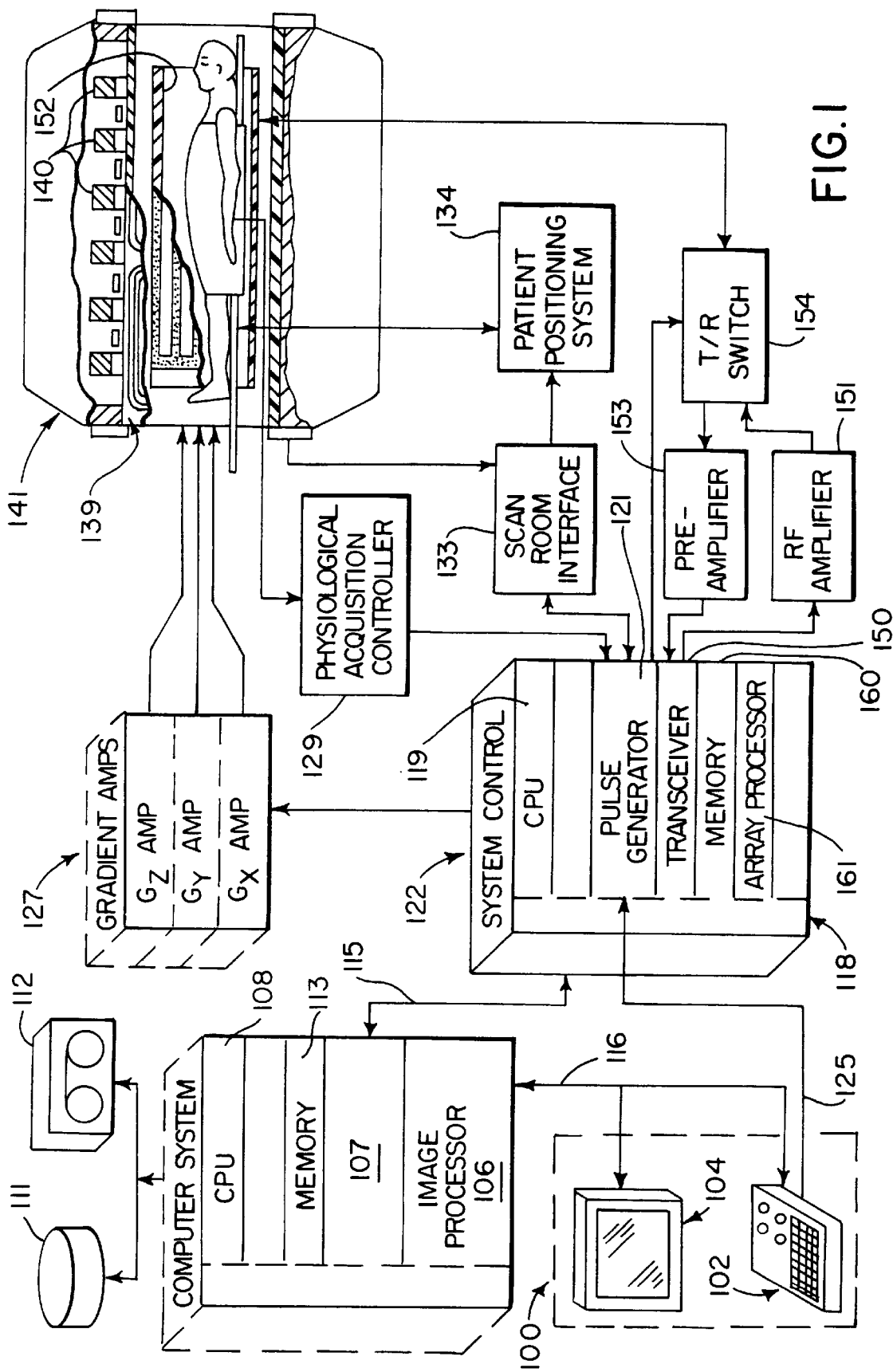
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
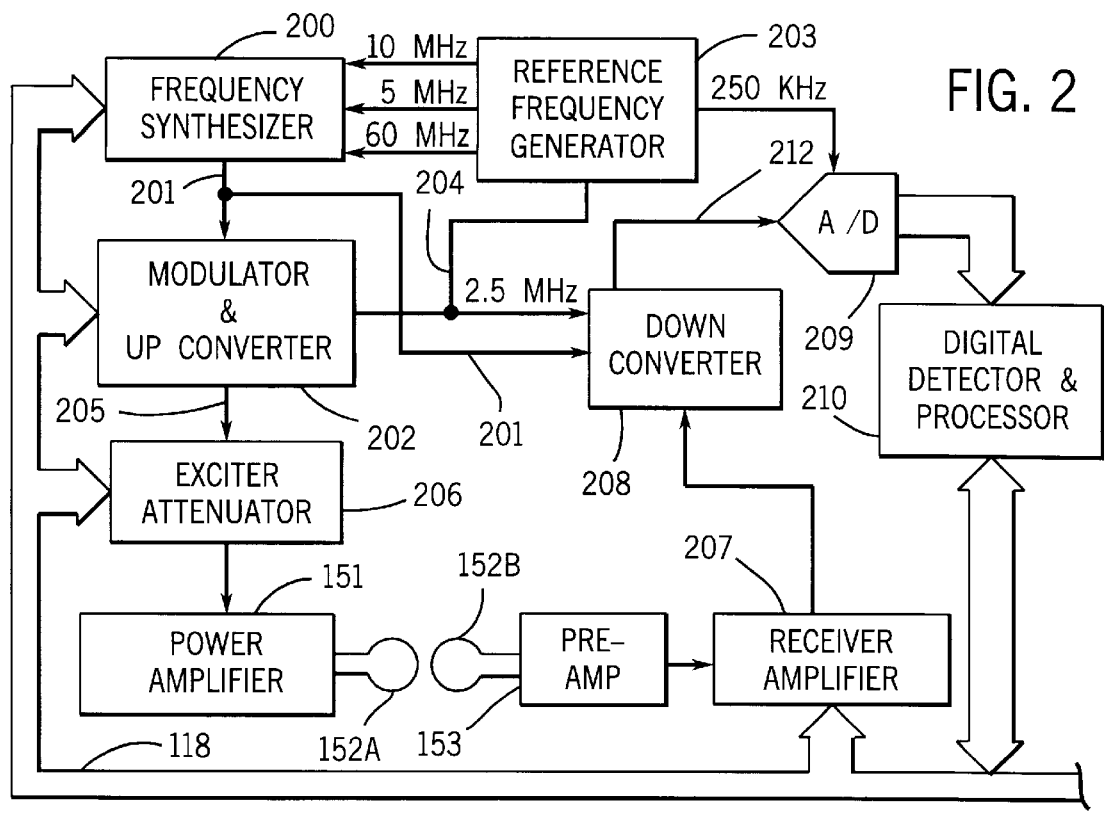
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 Mhz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 KHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
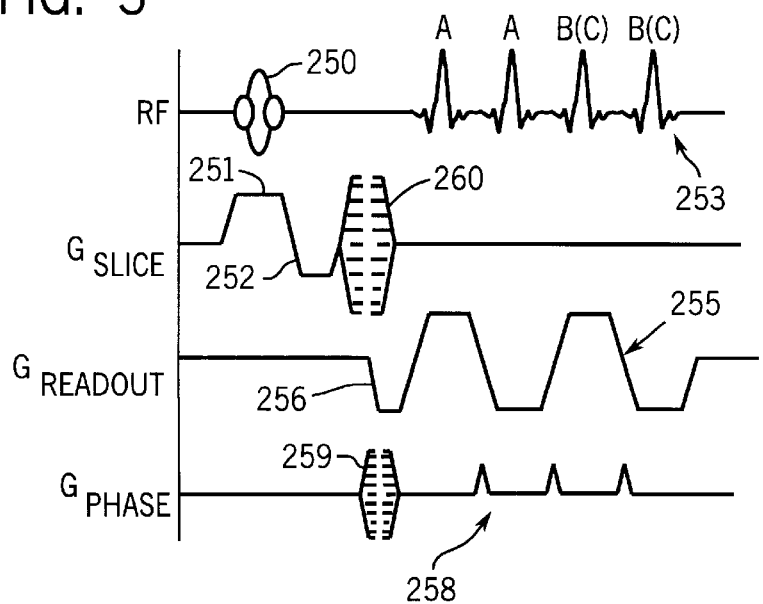
FIG. 3 is a graphic representation of the pulse sequence employed in the preferred embodiment of the invention.

The EPI pulse sequence employed in the preferred embodiment of the invention is illustrated in FIG. 3. An RF excitation pulse 250 is applied in the presence of a slice selection gradient pulse 251 to produce transverse magnetization in a three-dimensional volume of interest. Because a short repetition rate (TR) is used, a flip angle of from 20° to 40° is applied. The excited spins are rephased by a negative lobe 252 on the slice selection gradient and then a gradient pulse 260 is applied to phase encode along the z-axis. The gradient pulse 260 is stepped through 16 values during the scan to separately encode 16 slices in the excited volume. Four NMR signals indicated generally at 253 are acquired during the EPI pulse sequence. Each NMR signal 253 is a different view which is separately phase encoded by gradient pulses 258 to sample $k_y$-space. A pre-phasing phase-encoding gradient pulse 259 is stepped through values during the scan to implement the view order which will be described in detail below.

The NMR echo signals 253 are gradient recalled echoes produced by the application of an oscillating readout gradient 255. The readout sequence starts with a prephasing readout gradient lobe 256 and the echo signals 253 are produced as the readout gradient oscillates between positive and negative values. A number of samples (e.g., 128) are acquired of each NMR echo signal 253 during each readout gradient pulse 255. As explained above, the successive NMR echo signals 253 are separately phase encoded along the y-axis by the series of phase encoding gradient pulses 258.

Figure 4:
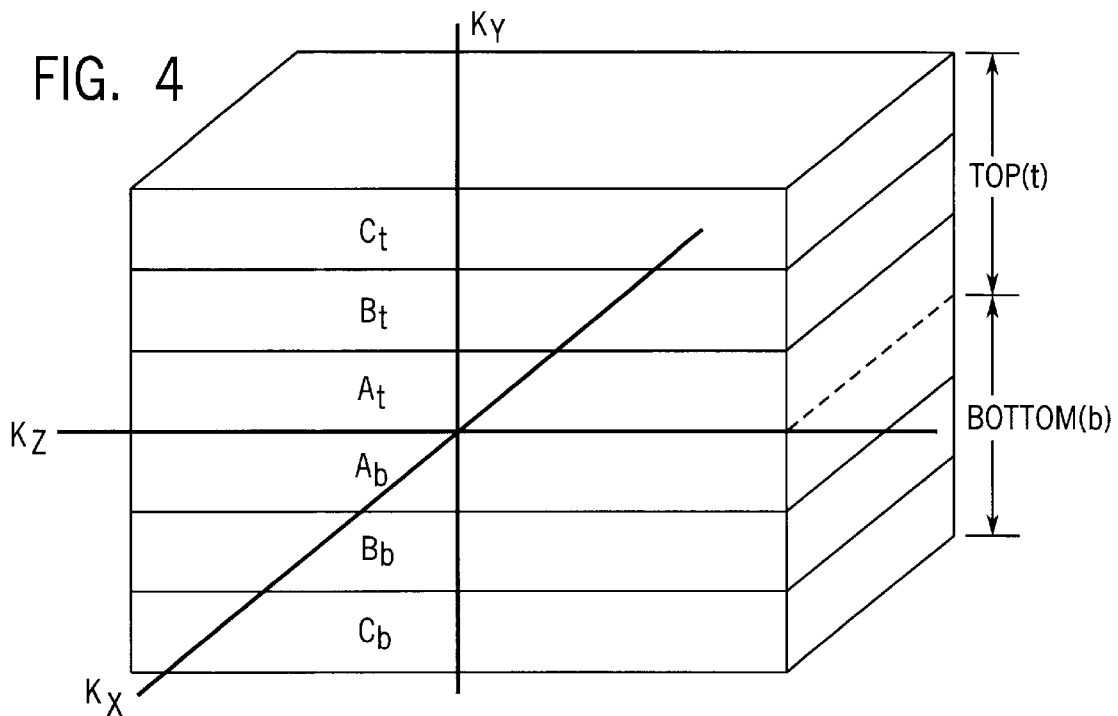
FIG. 4 is a graphic representation of three-dimensional k-space from which data is sampled when practicing the preferred embodiment of the invention.

Rather than acquiring an entire slice in a single pulse sequence, the EPI pulse sequence is repeated and the phase encoding pulses 259 and 260 are stepped through a series of values to sample the 3D k-space depicted in FIG. 4. In the preferred embodiment sixteen phase encodings are employed along the z axis and 384 phase encodings are employed along the y axis. For each particular y phase encoding, therefore, sixteen acquisitions with sixteen different z phase encodings are performed to sample completely along the $k_z$ axis. This is repeated 384 times with 384 different y phase encodings to sample completely along the $k_y$ axis. As will become apparent from the discussion below, the order in which this sampling is performed is important. Sampling along the $k_x$ axis is performed by sampling each echo signal 253 in the presence of the corresponding readout gradient pulse 255.

Referring particularly to FIG. 4, to perform a dynamic study according to the preferred embodiment, the k-space to be sampled is divided into three regions designated "A–C". The boundaries of these regions A–C are disposed along the $k_y$ axis and are symmetrical about $k_y$=0. A central region "A" occupies the central k-space region ranging from $k_y$=–63 to 64, and as is well known in the art, these "central" samples contain most of the information which determines the overall contrast in the reconstructed image. As will now be described, it is this central k-space region A which forms the basis for each frame image in the dynamic study and which determines the eventual temporal frame rate.

The remaining two "peripheral" k-space regions B and C are divided into top and bottom regions disposed on opposite sides of the central region A. They occupy k-space over the following ranges:

Region B–$k_y$=65 to 128 and –64 to –127

Region C–$k_y$=129 to 192 and –128 to –191

Figure 5:
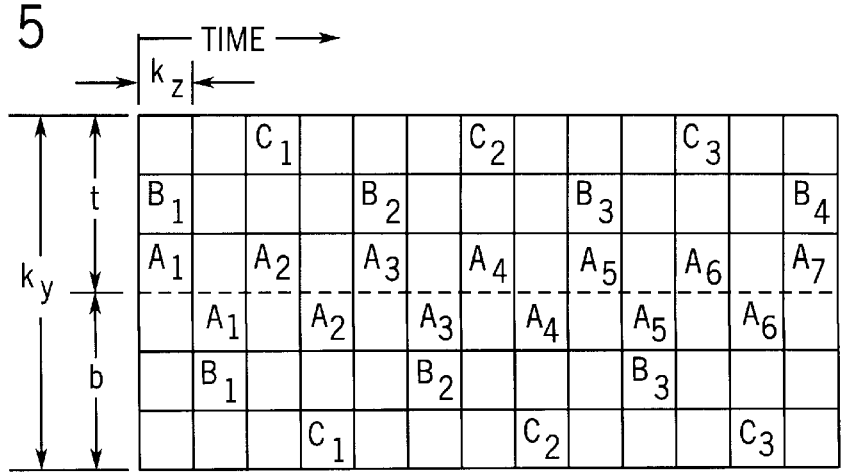
FIG. 5 is a graphic representation of the order in which the three-dimensional k-space of FIG. 4 is sampled.

The central region of k-space is sampled at a higher rate than the peripheral regions during the dynamic study. In the preferred embodiment this is achieved by sampling the top or bottom of the central region A and one of the top or bottom of a peripheral region B or C during each EPI pulse sequence. The following sampling sequence is thus performed during the dynamic study:

$A_t \, A_b \, A_t \, A_b \, A_t \, A_b \ldots$ $B_t \, B_b \, C_t \, C_b \, B_t \, B_b \ldots$ This sampling sequence is shown graphically in FIG. 5, where the horizontal axis indicates real time during the dynamic study and the vertical axis is the region in k-space along the $k_y$ axis that is being sampled. The time periods during which each k-space region A–C is sampled are labelled, and the subscripts indicate the number of times the region has been sampled during the dynamic study. It is readily apparent that the central k-space region A is sampled at a higher temporal rate than the peripheral k-space regions B–C. It can be appreciated that this alternating sequence can be extended as long as necessary to encompass the contrast changes of interest that occur during the particular study.

It can be appreciated by those skilled in the art that k-space can be carved up in other ways to practice the present invention. For example, the number of regions can be changed and they can be oriented such that their boundaries are disposed along the slice-select $k_z$ axis. Also, k-space can be divided into a circular central region and a plurality of surrounding, annular-shaped peripheral regions.

The data acquired during the dynamic study can be used in a number of ways to reconstruct a series of frame images that depict contrast changes occurring during the dynamic study. As described in detail in the above-cited co-pending patent application Ser. No. 08/622,718, this is accomplished by forming a data set sufficient to reconstruct a frame image using central k-space region data ($A_t$ and $A_b$) combined with temporally adjacent data from the surrounding, peripheral k-space regions B and C. Each image frame data set thus formed is Fourier transformed along each of its three axes in the array processor 161 to reconstruct an image. Each image frame depicts the subject at a particular time during the dynamic study.

Referring particularly to FIG. 3, the echo-planar pulse sequence acquires four NMR signals 253 with each RF excitation pulse 250. The first two NMR signals 253 are phase encoded to sample the A section of k-space, and the final two NMR signals 253 are phase encoded to sample either the B region or the C region of k-space. During each EPI pulse sequence one view is acquired from the top half of the A region ($A_t$) and one view is acquired from the bottom half ($A_b$). The third NMR signal 253 is phase encoded to sample either the top half of the B region ($B_t$) or the top half of the C region ($C_t$), and the fourth NMR signal 253 is phase encoded to sample either the bottom half ($B_b$) or ($C_b$). As a result, the central region A is sampled substantially continuously during the scan to establish the basic frame rate and the sampling of regions B and C are alternately sampled in an interleaved manner.

While variations in the preferred pulse sequence are possible, the choice of four NMR signals per excitation provides a number of advantages. First, because the echo train is relatively short, many of the disadvantages associated with using an EPI pulse sequence are avoided. Second, the pulse repetition rate (TR=10 msec) of the preferred EPI pulse sequence is approximately four times longer than the fast gradient recalled echo pulse sequences usually employed in contrast enhanced MRA. It is known in the art that image contrast in a contrast enhanced MRA image is improved as a function of the square root of the TR period. As a result, an improved contrast-to-noise ratio ("CNR") is achieved with the longer EPI pulse sequence. And finally, even though TR is increased to improve CNR, there is no loss in either image resolution or temporal resolution because four views are acquired per TR period. Indeed, when compared with prior scans using fast gradient echo sequences, the preferred EPI pulse sequence with four views enables the same temporal frame rate of one image frame every five seconds to be maintained, while providing an increase in the spatial resolution. The y-axis phase encodings are increased from 128 to 384, and the spatial resolution along the y-axis is thus tripled without a loss in CNR and without a loss in temporal frame rate.

The present invention is particularly applicable to contrast enhanced MRA. However, it can also be applied to other dynamic contrast enhanced NMR examinations. One such possible application is a study of the contrast agent uptake in tumors. It can also be used in 2D contrast enhanced examinations where the CNR is dependent on the TR period. For example, the real time tracking of a catheter which has been doped with a contrast agent may be improved using the present invention.

What is claimed is:

1. A method for acquiring contrast enhanced NMR data from a subject to produce a series of frame images by repeatedly acquiring samples from a selected k-space during a dynamic study of the subject, the steps comprising:

administering a contrast agent to the subject which enhances NMR signals;

performing a series of NMR data acquisitions using an echo-planar pulse sequence to sample a central region of the selected k-space at a temporal rate; and to sample peripheral regions of the selected k-space at a lower temporal rate, each echo-planar pulse sequence acquiring a plurality of NMR signals which each sample a portion of k-space and the number of NMR signals acquired during each echo-planar pulse sequence being limited such that the contrast between contrast enhanced tissues and other tissues is not substantially diminished;

forming a data set for each set of central region k-space samples, which includes said central region k-space samples and samples derived from the most temporally adjacent samplings of the peripheral k-space regions; and reconstructing a frame image from each data set.

2. The method as recited in claim 1 in which the NMR data is acquired from a three-dimensional region of the subject.

3. The method as recited in claim 1 in which there are two different peripheral k-space regions and the k-space is repeatedly sampled during the dynamic study by alternately sampling the central k-space region and one of the two different peripheral k-space regions.

4. The method as recited in claim 1 in which a portion of the central k-space region is sampled by each echo-planar pulse sequence.

5. The method as recited in claim 5 in which a portion of only one of said peripheral regions is sampled by each echo-planar pulse sequence.

6. The method as recited in claim 5 in which each echo-planar pulse sequence samples the central k-space region a plurality of times.

7. The method as recited in claim 1 in which the number of NMR signals acquired during each echo-planar pulse sequence is substantially four.

8. The method as recited in claim 7 in which two of the NMR signals sample a portion of the central region of k-space.

9. The method as recited in claim 8 in which the remaining NMR signals in each echo-planar pulse sequence sample a portion of a peripheral region of k-space.

10. A method for producing a contrast enhanced NMR image of a subject, the steps comprising:

a) administering a contrast agent to the subject which enhances NMR signals;

b) performing an echo-planar pulse sequence to acquire substantially four NMR signals which each sample different portions of k-space;

c) acquiring a k-space data set from which an image can be reconstructed by repeating step b) a plurality of times; and d) reconstructing an image from the acquired k-space data set.

11. The method as recited in claim 10 in which one of the NMR signals in each echo-planar pulse sequence samples a central region of k-space.

* * * * *